United States Patent
Heiland

(10) Patent No.: US 8,352,086 B2
(45) Date of Patent: Jan. 8, 2013

(54) COMBINED MOTION SENSOR FOR USE IN FEEDBACK CONTROL SYSTEMS FOR VIBRATION ISOLATION

(75) Inventor: Peter Heiland, Raunheim (DE)

(73) Assignee: Integrated Dynamics Engineering GmbH (DE)

( * ) Notice: Subject to any disclaimer, the term of this patent is extended or adjusted under 35 U.S.C. 154(b) by 208 days.

(21) Appl. No.: 12/707,860

(22) Filed: Feb. 18, 2010

(65) Prior Publication Data

US 2010/0211225 A1  Aug. 19, 2010

(30) Foreign Application Priority Data

Feb. 19, 2009  (DE) .......................... 10 2009 009 562

(51) Int. Cl.
*G01M 1/38* (2006.01)
*G05B 13/00* (2006.01)
*G05B 15/00* (2006.01)
*G05D 23/00* (2006.01)
*G05B 13/02* (2006.01)
*H03F 1/26* (2006.01)
*H04B 15/00* (2006.01)

(52) U.S. Cl. .............. 700/280; 700/44; 700/45; 702/56; 702/195

(58) Field of Classification Search ............... 700/28, 700/44–45, 279–280; 702/56, 195
See application file for complete search history.

(56) References Cited

U.S. PATENT DOCUMENTS

| | | | |
|---|---|---|---|
| 5,409,078 A | 4/1995 | Ishioka et al. | |
| 5,465,924 A | 11/1995 | Schneider | |
| 6,036,162 A * | 3/2000 | Hayashi | 248/550 |
| 6,375,147 B1 * | 4/2002 | Radziun et al. | 248/638 |
| 6,874,748 B2 * | 4/2005 | Hanagan | 248/550 |
| 7,532,951 B2 * | 5/2009 | Sato | 700/280 |
| 7,554,105 B2 * | 6/2009 | Franken et al. | 250/492.2 |
| 7,689,385 B2 * | 3/2010 | Shen | 702/190 |
| 7,891,673 B2 * | 2/2011 | Delorenzis et al. | 280/5.507 |
| 7,942,379 B2 * | 5/2011 | Heiland | 248/618 |

(Continued)

FOREIGN PATENT DOCUMENTS

DE  34 33 189 A1  4/1885

(Continued)

OTHER PUBLICATIONS

German Office Action, German Patent Office, Application No. 10 2009 009 562. 4-13.

(Continued)

*Primary Examiner* — Ramesh Patel
(74) *Attorney, Agent, or Firm* — Kaplan, Breyer, Schwarz & Ottesen, LLP

(57) ABSTRACT

The present invention relates to a method for controlling a vibration isolation system, and an active vibration isolation system for vibration-isolated support of lithographic devices, wafer handling systems, and/or scanning microscopes. For this purpose the following are provided: a number of vibration transducers for supplying sensor signals which are representative of vibrations; a number of actuators for vibration compensation which may be controlled by supplying actuator control signals; a control device which is designed for processing the supplied sensor signals to form the actuator control signals, wherein the vibration transducers have at least one geophone sensor as a first acceleration sensor for detecting vibrations in a first frequency range, and at least one second acceleration sensor, which is different from the first acceleration sensor, for detecting vibrations in a second frequency range which extends the first frequency range.

14 Claims, 4 Drawing Sheets

U.S. PATENT DOCUMENTS

| | | |
|---|---|---|
| 2002/0117109 A1 | 8/2002 | Hazelton et al. |
| 2003/0057346 A1* | 3/2003 | Wakui ........................... 248/550 |
| 2008/0048405 A1* | 2/2008 | DeLorenzis et al. ....... 280/6.159 |
| 2011/0062306 A1* | 3/2011 | Heiland ........................ 248/636 |

FOREIGN PATENT DOCUMENTS

| | | |
|---|---|---|
| DE | 696 30 509 T2 | 12/2004 |
| DE | 103 56 561 A1 | 6/2005 |
| DE | 600 21 402 T2 | 6/2006 |
| EP | 1 840 681 A1 | 10/2007 |
| WO | 2007/072357 A3 | 6/2007 |

OTHER PUBLICATIONS

Chris Heryet, "European Office Action for International Application 10 001 252.5", May 19, 2010, Publisher: European Patent Office, Published in: EP.

\* cited by examiner

COMBINED MOTION SENSOR FOR USE IN FEEDBACK CONTROL SYSTEMS FOR VIBRATION ISOLATION

CROSS-REFERENCE TO RELATED APPLICATIONS

The German patent application DE 10 2009 009 562.4, filed Feb. 19, 2009, is incorporated herein by reference.

FIELD OF THE INVENTION

The present invention relates to an active vibration isolation system for vibration-isolated support of lithographic devices, wafer handling systems, and/or microscopes, for example scanning microscopes.

BACKGROUND OF THE INVENTION

Vibration isolation systems are known, and are required in many technological sectors, for example in the semiconductor industry. DE 69817750 T2, for example, discloses a vibration isolation system which is provided in particular for vibration-isolated support of a lithographic device. A load to be supported, which typically includes a platform and components supported thereon, for example production equipment, is supported on air bearings.

In addition to a support having the lowest possible mechanical rigidity, active vibration isolation systems have sensors and actuators which in a targeted manner counteract external vibrations which penetrate the system. The sensors detect motions of the load being supported. By means of a control device, compensation signals are generated which control actuators and thus generate compensating motions. In this manner it is possible to use digital or analog control loops, or to use both together, referred to as hybrid control loops.

The demands on vibration isolation systems are becoming ever more stringent with increasing miniaturization in the semiconductor industry. In the prior art, so-called geophones are typically used as sensors to record the mass movements.

A geophone is an electromechanical transducer which converts the detected vibrations into analog and/or digital signals. In general, a geophone essentially comprises a coil and a permanent magnet, the coil being connected to the permanent magnet via a spring. When a relative motion caused by vibration occurs between the coil and magnet, a voltage is induced in the coil which is proportional to the velocity of the motion. Geophones are fairly inexpensive, and by use of suitable measures have a frequency response characteristic which extends to very low frequencies, in particular as low as 0.1 Hz or even lower. In contrast, at high frequencies the bandwidth of the frequency response characteristic for a geophone generally extends only to approximately 300 Hz, which in most cases is adequate for vibration isolation. However, detection of higher frequencies using the geophone itself is not possible.

SUMMARY OF THE INVENTION

The object of the present invention, therefore, is to provide an apparatus and a method for active vibration isolation which at least prevents the above-described disadvantages of the prior art.

The aim is to extend the control bandwidth of the vibration isolation to high frequencies.

It is the aim in particular to allow the invention to be integrated into existing control system designs, or to allow the known control system designs to be enhanced.

In general, the invention is based on use of a combination of two different types of sensors for increasing the control bandwidth of vibration isolation systems known as such.

In a first embodiment the present patent application claims an active vibration isolation system, in particular for vibration-isolated support of lithographic devices, wafer handling systems, and/or microscopes, comprising
- a plurality of vibration transducers for supplying sensor signals which are representative of vibrations,
- a number of actuators for vibration compensation which may be controlled by supplying actuator control signals,
- a control device which is provided for processing the supplied sensor signals to form the actuator control signals,
wherein the vibration transducers
- have at least one first acceleration sensor, which preferably is designed as a geophone sensor, for detecting vibrations in a first frequency range and
- at least one second acceleration sensor, which is different from the first acceleration sensor, for detecting vibrations in a second frequency range which extends the first frequency range.

Also within the scope of the invention is a method for controlling an active vibration isolation system, in particular for vibration-isolated support of lithographic devices, wafer handling systems, and/or microscopes, comprising the following steps:
- Detecting vibrations by use of a plurality of vibration transducers,
- Providing sensor signals which represent the detected vibrations,
- Processing the provided sensor signals to form actuator control signals for controlling actuators,
- Supplying the actuator control signals to the actuators for counteracting the vibrations, wherein
- the vibration transducers are provided by at least one first acceleration sensor which is preferably designed as a geophone sensor for detecting vibrations in a first frequency range, and
- at least one second acceleration sensor, which is different from the first acceleration sensor, for detecting vibrations in a second frequency range which extends the first frequency range is provided, and
- the sensor signals from the first acceleration sensor and the sensor signals from the second acceleration sensor are combined into joint actuator control signals for controlling the actuators.

The method according to the invention may be carried out in particular by using the system according to the invention. The system according to the invention is designed in particular to carry out the method according to the invention.

The sensor signals may be analog and/or digital signals. A sensor signal may be a signal which includes only the vibrations or an interference variable in one degree of freedom. However, the sensor signal may also be a signal which includes the vibrations or an interference variable in a plurality of degrees of freedom. The referenced plurality of vibration transducers corresponds to at least two or more vibration transducers.

Since more than two sensors are generally used, in one embodiment a first acceleration sensor and a second acceleration sensor in each case are arranged in pairs. To enable such a pair to determine the interference variables from the same interference sources and/or from the same direction, the first and second acceleration sensors are placed in spatial proximity to one another. In one preferred embodiment, the first and second acceleration sensors are spaced less than approximately 30 cm, preferably less than approximately 10 cm, apart.

The first acceleration sensor is preferably designed as a geophone sensor. The first frequency range is up to approximately 300 Hz. Thus, the first acceleration sensor is effective in a frequency range of up to approximately 300 Hz.

In order to achieve the corresponding extension of the frequency range to high frequencies, the second acceleration sensor is effective in a frequency range, in the present case the referenced second frequency range, of up to approximately 1.5 kHz, preferably up to approximately 5 kHz. In one embodiment of the invention the second acceleration sensor is a piezoelectric acceleration sensor.

In one refinement of the present invention, the vibration isolation system has a circuit for combining the sensor signals from the first acceleration sensor and the sensor signals from the second acceleration sensor to form a joint actuator control signal or joint actuator control signals for controlling the actuators. If the detected frequencies of the first acceleration sensor and of the second acceleration sensor overlap, in the overlapping signal portions it is important to perform correct addition or combination without increasing the amplitude in the overlapping portions. For this purpose, for example, at least one high-pass filter and/or at least one low-pass filter are provided for adapted addition of the overlapping signal portions and/or for frequency division.

The actuator control signals may be analog and/or digital signals. An actuator control signal represents a type of compensation signal. A vibration of a load to be supported is actively compensated. The referenced number of actuators generally corresponds to a plurality of actuators. The actuators may be effective in one degree of freedom or in a plurality of degrees of freedom of the motion. An actuator control signal may therefore be a signal which contains information for only one degree of freedom. However, the actuator control signal may also be a signal which contains information for a plurality of degrees of freedom.

The circuit for combining the sensor signals may be designed as an analog and/or digital circuit. Likewise, the control device may be a control device which operates in a digital and/or analog manner. In a first variant of the invention the first and second acceleration sensors are associated with one control device. The control device is connected, preferably directly, on the input side to the circuit for the combination. The control device is connected, preferably directly, on the output side to the actuators. In a second variant of the invention the control device is formed by a first control device which is associated with the first second [sic; first] acceleration sensor, and by a second control device which is associated with the second acceleration sensor. The first and second control devices are connected, preferably directly, on the output side to the circuit for the combination. The circuit for the combination is connected, preferably directly, on the output side to the actuators.

The control device, i.e., the first and/or second control device, is preferably a so-called feedback control. For example, in one design of the control device, i.e., the first and/or second control device, compensation signals, which may also be referred to as correction signals, may be calculated in three, or at least three, preferably six, degrees of freedom. In addition to a calculation of the three degrees of freedom of translation, improved or more precise control may be provided by additionally taking into account the three degrees of freedom of rotation.

It is also within the scope of the invention to use vibration transducers, comprising at least one first acceleration sensor for detecting vibrations in a first frequency range, and at least one second acceleration sensor, which is different from the first acceleration sensor, for detecting vibrations in a second frequency range which extends the first frequency range to high frequencies, in particular up to 5 kHz, for detecting vibrations in a vibration isolation system, in particular by use of at least one polymer spring element. The first acceleration sensor is preferably designed as a geophone sensor. The second acceleration sensor is preferably designed as a piezoelectric sensor.

BRIEF DESCRIPTION OF THE DRAWINGS

The present invention is explained in detail with reference to the following exemplary embodiments. To this end, reference is made to the accompanying figures. In the individual figures, identical parts are denoted by the same reference numerals.

DETAILED DESCRIPTION

Figure 1:
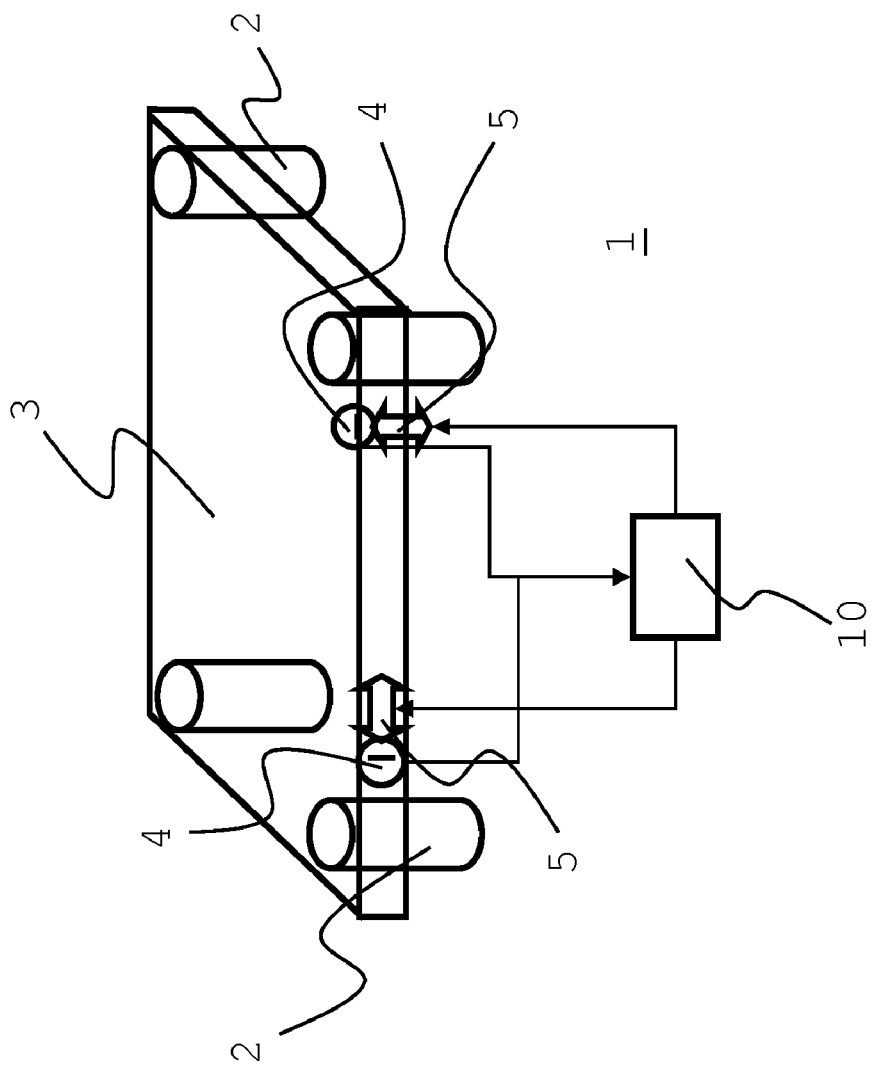
FIG. 1 schematically shows by way of example a known active vibration isolation system.

A known vibration isolation system 1 according to the invention includes a vibration-isolated load 3 to be supported, for example in the form of a platform 3. Devices to be supported with vibration isolation, not illustrated in the figure, may be placed on the platform 3.

Named as examples of the referenced devices are lithographic devices and/or wafer handling systems and/or microscopes, in particular scanning microscopes. Wafer handling systems are or include, for example, devices for transporting, supporting, holding, gripping, turning, machining, and/or testing wafers.

The load 3 is supported on bearings 2, for example air bearings 2. An air bearing 2 represents a passive system, i.e., a system for passive vibration isolation. Another example of a passive spring system is a polymer spring element (not illustrated in the figures).

For the active vibration compensation the known vibration isolation system 1 has sensors 4, in particular geophone sensors 4, as vibration transducers 4. In the exemplary embodiment shown, these sensors are illustrated for only two degrees of freedom of translation. By use of the geophone sensors 4, vibrations of the load 3 to be isolated are converted to signals and relayed to a control device 10. The vibration transducers 4 thus supply sensor signals which represent the vibrations.

Each control relies on receiving sensor signals which are proportional to the motion, in particular the acceleration, of the mass to be isolated. Based on the sensor signals the feedback control loop 10 then generates compensation signals, the above-referenced actuator control signals, which are used for controlling force actuators in order to isolate a mass from the moving base, or in general to reduce mass movements. Based on the sensor signals from the geophone sensors 4 the control device 10 calculates compensation signals for controlling actuators 5. Examples of the actuators 5 include Lorentz motors, for example plunger coils, and/or piezoelectric actuators. The control device 10 is designed to process the supplied sensor signals to form the actuator control signals.

Figure 2:
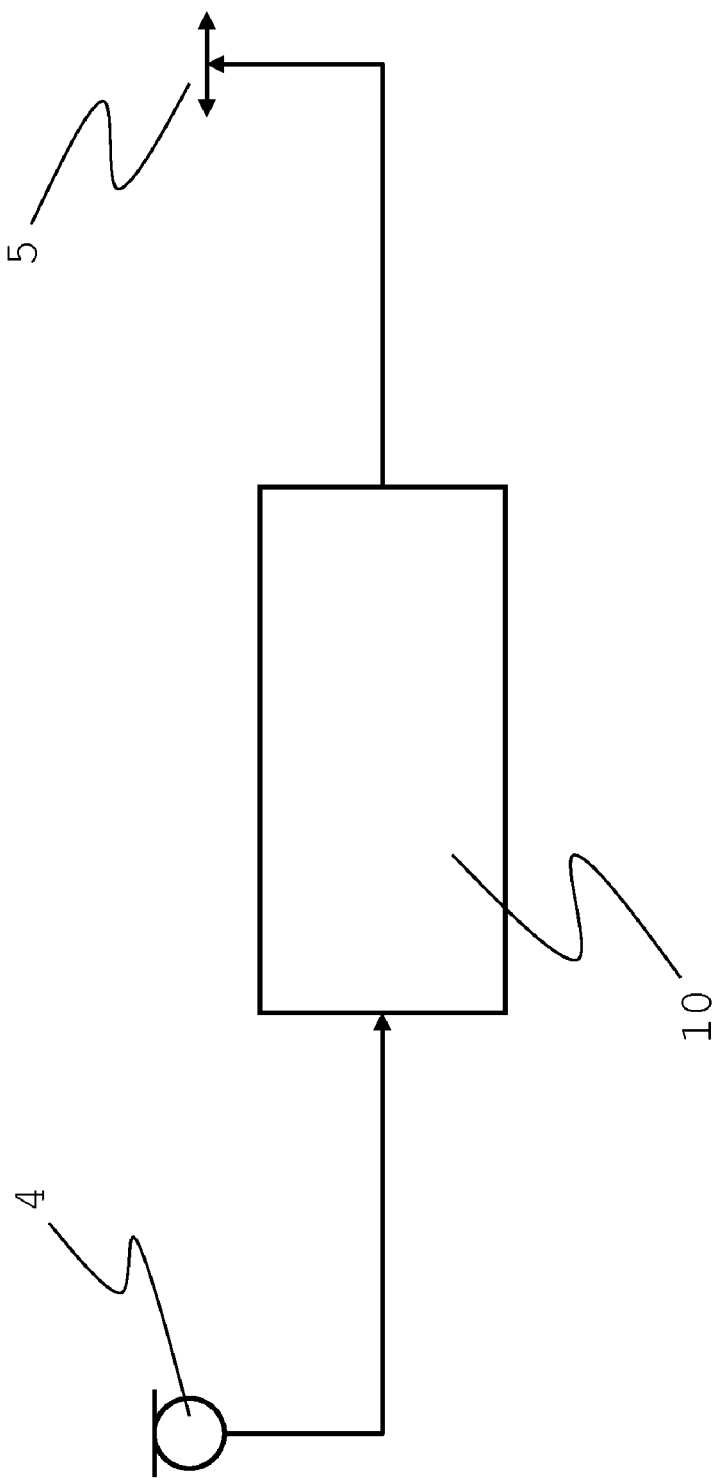
FIG. 2 shows a block diagram of a known configuration of a feedback control system.

FIG. 2 shows a block diagram of a known control device, i.e., a known configuration of a feedback control system, for a geophone 4 as a first acceleration sensor. Active vibration compensation may be performed by use of the actuators 5. In contrast to passive vibration isolation, which is characterized by a type of damping of the vibration or a type of "isolated" support of the load, active vibration isolation is characterized in particular by the fact that the vibration is actively compensated. A motion which is induced by a vibration is compensated by a corresponding countermotion. For example, a vibration-induced acceleration of the mass is opposed by an acceleration of equal magnitude but with the opposite algebraic sign. The overall acceleration of the load 3 which results is therefore equal to zero. The load 3 remains at rest or in the intended position.

The bandwidth of the frequency response characteristic of a geophone 4 generally extends only to approximately 300 Hz. Therefore, this is adequate for vibration isolation in most cases. The reason in particular is that the base of such a system forms a spring-mass damper system. The resonance frequency is typically less than 5 Hz, usually 1 Hz, rarely less than 0.5 Hz. The isolation effect, which is thus achieved passively, at 300 Hz is then great enough that it is not necessary to extend a control bandwidth to greater than 150 Hz. This generally results in a reduction in a range of approximately −40 dB per frequency decade.

For certain applications of vibration isolation it is necessary to make the control bandwidth as large as possible, preferably in a range of up to approximately 1.5 kHz or even up to approximately 5 kHz. This may be due to the fact that the passive mass-spring system, for example because of the use of so-called polymer spring elements, has a high resonance frequency, and/or that the structure of the mass and/or of the load 3 itself and/or of the substructure 2 of an isolation system 1 form additional resonances which are to be used in the active control, and thus in the monitoring and suppression of same. Structural resonances in particular may easily have frequencies in the kilohertz range, which therefore cannot be detected by the customary geophone sensors 4.

It is the aim to retain the known control designs. The control may be carried out in an analog and/or digital manner. The sampling rates for digital control are in a range of approximately 60 kHz to 100 kHz. According to the invention, the sensor signals are conditioned in such a way that all or essentially all of the signals may be recorded, and in particular are available in a phase position in which they are suitable for feedback control.

Due to the mechanical structure of a geophone 4 it is not possible to extend its frequency response characteristic to frequencies above 300 Hz. The invention is generally based on a combination of a geophone as a first acceleration sensor 4a and an acceleration recorder as a second acceleration sensor 4b. The acceleration recorder 4b is preferably a piezoelectric acceleration sensor. A signal is generated which is proportional to the mass movement and which preferably has a frequency bandwidth of up to 5 kHz, preferably for a simultaneous phase position, which allows the signal to be used for feedback control. For this purpose the two sensors, namely, the geophone 4a and the acceleration recorder 4b, are placed in the spatial proximity of one another. "Spatial proximity" is understood to mean a distance of less than approximately 10 cm between the two sensors 4a and 4b. If, for example, a plurality of first and second acceleration sensors 4a and 4b is used, a first acceleration sensor 4a and a second acceleration sensor 4b are each arranged in pairs, so to speak. The sensors may each be attached using a clamped or welded connection, for example at the bearing 2 and/or the load 3.

Figure 3:
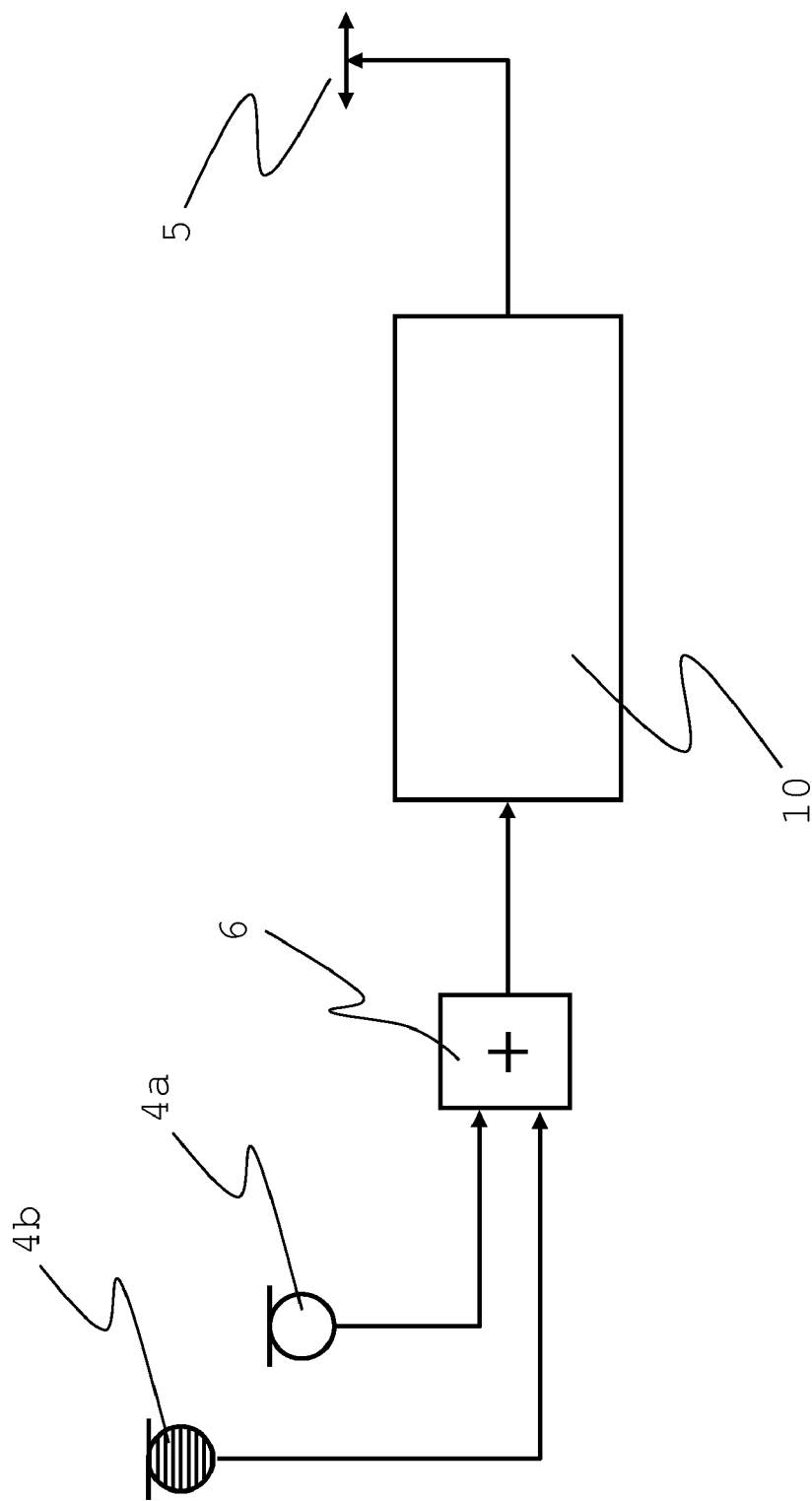
FIG. 3 shows a block diagram of an example of a first embodiment of the invention.

FIG. 3 shows a block diagram of a pair of sensors 4a and 4b in a first embodiment of the invention. In this case, the respective sensor signals from the first acceleration sensor 4a and the second acceleration sensor 4b are combined or added before they are used in the feedback control 10. This is carried out in a means 6 for combination or addition. The two signals may be combined in a completely analog manner, in a completely digital manner, or in a mixed form. In this regard, either high-pass filters or low-pass filters are used to ensure that the overlapping signal portions are correctly added without increasing the amplitude, or use is made of the "frequency characteristic" of the sensors. Use is made of the "natural" high- and/or low-pass filter characteristic in order to perform the frequency division.

Figure 4:
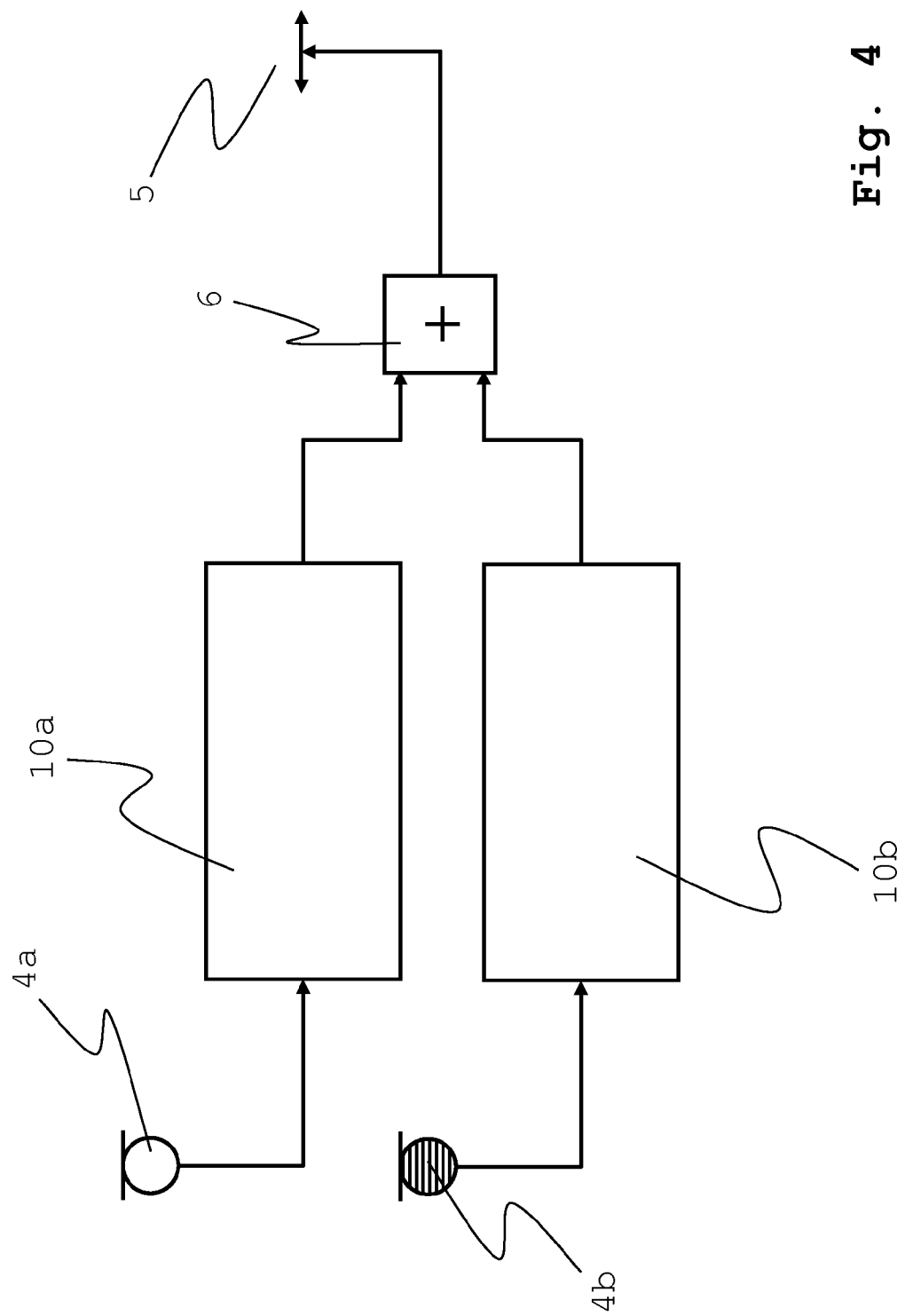
FIG. 4 shows a block diagram of an example of a second embodiment of the invention.

In contrast, FIG. 4 shows a block diagram of a pair of sensors 4a and 4b in a second embodiment of the invention. In this embodiment, in each case an independent feedback control system 10a and 10b is used for the geophones 4a and the acceleration recorders 4b, respectively, and the combination 6 is performed only in the actuator signal. A first control device 10a is associated with the geophone as a first acceleration sensor 4a, and a second control device 10b is associated with the acceleration recorder as a second acceleration sensor 4b. In this manner a control system 10 from the prior art is doubled in a manner of speaking, and the supplemented second [acceleration sensor] is used to achieve high-frequency control by use of the acceleration recorders 4b. Combination of the control signals is necessary only in the actuator branch. In this regard it must be ensured that the respective signal components are not added in such a way as to increase the amplitude.

In summary, in two embodiments the invention provides for the use of a combination of geophones 4a and acceleration recorders 4b for the purpose of vibration isolation via feedback control at a very high bandwidth. In a first embodiment, these two sensor signals are added to form a virtual sensor signal having a high-frequency bandwidth. The addition may be performed in an analog, digital, or hybrid manner. In a second embodiment, the control in the two frequency ranges is carried out by separate control systems by use of the respective sensors 4a and 4b as inputs, whereby the addition 6 is not performed until the point in time that the actuator signal is provided.

It is obvious to one skilled in the art that the described embodiments are to be construed as examples. The invention is not limited to same, but, rather, may be varied in many ways without departing from the spirit of the invention. Features of individual embodiments and the features stated in the general part of the description may each be combined with one another, or also collectively combined.

LIST OF REFERENCE NUMERALS

1 Vibration isolation system
2 Bearing
3 Load
4 Sensor or vibration transducer
4a Geophone sensor or first acceleration sensor
4b Acceleration recorder or second acceleration sensor
5 Actuator
6 Means for adding the signals
10 Control device
10a First control device or first control system
10b Second control device or second control system

What is claimed is:

1. Active vibration isolation system (1) for vibration-isolated support of lithographic devices, wafer handling systems, and/or microscopes, comprising:
   a plurality of vibration transducers (4a, 4b) for supplying sensor signals which are representative of vibrations;
   a plurality of actuators (5) for vibration compensation which may be controlled by supplying actuator control signals; and
   a control device (10, 10a, 10b) for processing the supplied sensor signals to form the actuator control signals, the control device having an input side and an output side, wherein the vibration transducers (4a, 4b) have
      at least one first acceleration sensor (4a) for detecting vibrations in a first frequency range and
      at least one second acceleration sensor (4b), which is different from the first acceleration sensor, for detecting vibrations in a second frequency range which extends the first frequency range.

2. Vibration isolation system (1) according to claim 1, characterized in that in the first frequency range the first acceleration sensor (4a) is effective in a range of up to 300 Hz.

3. Vibration isolation system (1) according to claim 1, characterized in that the first acceleration sensor (4a) is designed as a geophone sensor.

4. Vibration isolation system (1) according to claim 1, characterized in that in the second frequency range the second acceleration sensor (4b) is effective in a range of up to 1.5 kHz.

5. Vibration isolation system (1) according to claim 1, characterized in that the second acceleration sensor (4b) is a piezoelectric acceleration sensor.

6. Vibration isolation system (1) according to claim 5, characterized in that the first and second acceleration sensors (4a and 4b, respectively) are spaced less than 30 cm apart.

7. Vibration isolation system (1) according to claim 1, characterized by a circuit (6) for combining the sensor signals from the first acceleration sensor (4a) and the sensor signals from the second acceleration sensor (4b) to form joint actuator control signals for controlling the actuators (5).

8. Vibration isolation system (1) according to claim 1, characterized in that the first and second acceleration sensors (4a and 4b, respectively) are associated with the control device (10).

9. Vibration isolation system (1) according to claim 7, characterized in that the control device (10) is connected on the input side to the circuit (6) for combining.

10. Vibration isolation system (1) according to claim 1, characterized in that the control device (10) is connected on the output side to the actuators (5).

11. Vibration isolation system (1) according to claim 7, characterized in that the control device (10) comprises a first control device (10a) which is associated with the first acceleration sensor (4a), and a second control device (10b) which is associated with the second acceleration sensor (4b).

12. Vibration isolation system (1) according to claim 11, characterized in that the first and second control devices (10a and 10b, respectively) are connected on the output side to the circuit (6) for combining.

13. Vibration isolation system (1) according to claim 11, characterized in that the circuit (6) for combining is connected on the output side to the actuators (5).

14. Method for controlling a vibration isolation system (1) for vibration-isolated support of lithographic devices, wafer handling systems, and/or microscopes, comprising:
   detecting vibrations by use of a plurality of vibration transducers (4, 4a, 4b);
   providing sensor signals which represent the detected vibrations;
   processing the provided sensor signals to form actuator control signals for controlling actuators (5); and
   supplying the actuator control signals to the actuators (5) for counteracting the vibrations, wherein the vibration transducers (4, 4a, 4b) are provided by
      a first acceleration sensor (4a) for detecting vibrations in a first frequency range, and
      a second acceleration sensor (4b), which is different from the first acceleration sensor, for detecting vibrations in a second frequency range which extends the first frequency range, and
   wherein the sensor signals from the first acceleration sensor (4a) and the sensor signals from the second acceleration sensor (4b) are combined into joint actuator control signals for controlling the actuators (5).

* * * * *